United States Patent [19]
Uratsuji

[11] Patent Number: 5,374,197
[45] Date of Patent: Dec. 20, 1994

[54] IC SOCKET

[75] Inventor: Kazumi Uratsuji, Tokyo, Japan

[73] Assignee: Yamaichi Electronics Co. Ltd., Tokyo, Japan

[21] Appl. No.: 198,773

[22] Filed: Feb. 18, 1994

[30] Foreign Application Priority Data

Feb. 22, 1993 [JP] Japan ................................. 5-057903

[51] Int. Cl.⁵ ......................................... H01R 23/72
[52] U.S. Cl. ........................................ 439/71; 439/330
[58] Field of Search ..................... 439/70, 71, 72, 73, 439/330, 525, 526

[56] References Cited

U.S. PATENT DOCUMENTS

| | | | |
|---|---|---|---|
| 4,750,890 | 6/1988 | Dube et al. | 439/330 X |
| 4,846,703 | 7/1989 | Matsuoka et al. | 439/81 X |
| 5,176,524 | 1/1993 | Mizuno et al. | 439/330 X |
| 5,290,192 | 3/1994 | Espenshade et al. | 439/70 X |
| 5,301,416 | 4/1994 | Foerstel | 439/330 X |
| 5,306,167 | 4/1994 | Nagumo | 439/70 X |

*Primary Examiner*—Gary F. Paumen
*Assistant Examiner*—Daniel Wittels
*Attorney, Agent, or Firm*—Wenderoth, Lind & Ponack

[57] ABSTRACT

An IC socket including a socket body and an IC receiving portion formed in the socket body and having an open top at an upper surface of the socket body and an open bottom at a lower surface thereof, the IC being loaded into the IC receiving portion through the open bottom, the improvement comprising a lifter for lifting the IC into a raised-position within the IC receiving portion, contacts arranged on the socket body so as to be pressure contacted with contacting elements of the IC by a lifting force of the lifter applied to the IC, and engagement means for engaging the lifter so that the IC is held in the raised-position.

6 Claims, 3 Drawing Sheets

IC SOCKET

BACKGROUND OF THE INVENTION

1. Field of the Invention

This invention relates to an IC socket in which an IC is received in an IC receiving portion formed in a socket body and contacting elements of the IC are pressed against contacts which are arranged on a peripheral area of the IC receiving portion so that the IC can be held in electrical connection with the contacts.

2. Prior Art

Heretofore, an IC socket of the type just mentioned generally comprises a socket body and an IC receiving portion formed in the socket body, the IC receiving portion having an open top at an upper surface of the socket body. In operation, an IC is inserted into the IC receiving portion from above and then the IC is depressed by a suitable means such as a presser cover lying over the upper surface of the socket body so that the contacting elements of the IC may be pressure contacted with contacts arranged on the socket body.

However, in the IC socket of the type above outlined, it is difficult to see whether the contacting elements of the IC are properly held in pressure contact with the contacts because the areas of connection between the contacting elements of the IC and the contacts of the socket body are hidden by the IC and such pressure contacting means as the presser cover.

Recently, as a special background, with the progress of a smaller pitch arrangement of the contacting elements group of an IC, it becomes more and more difficult to hold each socket contact and each IC contacting element in correct corresponding relation. In other words, a correct corresponding relation between each socket contact and each IC contacting element tends to be readily broken. Heretofore, in order to check this out-of-corresponding-relation between each socket contact and each IC contacting element, a sample socket is selected from a number of IC sockets and for such selected sample, an electrical check is made on each contact and lead using a tester. As another method, a socket with an IC loaded thereon is fully embedded in a synthetic resin and hardened. Thereafter, the socket is cut along the contacting line and the cutting face is observed to check whether the product (socket) is in a good condition. However, these conventional methods are not satisfactory in reliability.

Furthermore, in the conventional IC socket, the IC is inserted into the IC receiving portion from above in order to bring the IC contacting elements into pressure contact with the socket contacts and therefore, it is not difficult to smoothly remove the IC from the socket body. To facilitate a smooth removal of the IC from the socket body, it is a common practice to use vacuum or a pincette. However, here again, there is a possibility for this method to damage the IC while the IC is being removed from the socket body.

OBJECT AND SUMMARY OF THE INVENTION

It is therefore an object of the present invention to provide an IC socket in which a contacting state between an IC and a socket can easily be recognized by eyes.

According to the present invention, there is provided an IC socket including a socket body and an IC receiving portion formed in the socket body and having an open top at an upper surface of the socket body and an open bottom at a lower surface thereof, the IC being loaded into the IC receiving portion through the open bottom, the improvement comprising a lifter for lifting the IC into a raised-position within the IC receiving portion, contacts arranged on the socket body so as to be pressure contacted with contacting elements of the IC by a lifting force of the lifter applied to the IC, and engagement means for engaging the lifter so that the IC is held in the raised-position.

From another aspect of the invention, there is also provided an IC socket including a socket body and an IC receiving portion formed in the socket body and having an open top at an upper surface of the socket body and an open bottom at a lower surface thereof, the IC being loaded into the IC receiving portion through the open bottom, the improvement comprising a wiring board integral with the socket body and connected to contacts of the socket body on a lower surface side of the socket body, the wiring board being provided with an IC inlet port corresponding to the open bottom of the IC receiving portion, a lifter for lifting the IC into a raised-position within the IC receiving portion through the IC inlet port, and engagement means for engaging the lifter so that the IC is held in the raised-position.

DETAILED DESCRIPTION OF THE EMBODIMENT

Figure 1:
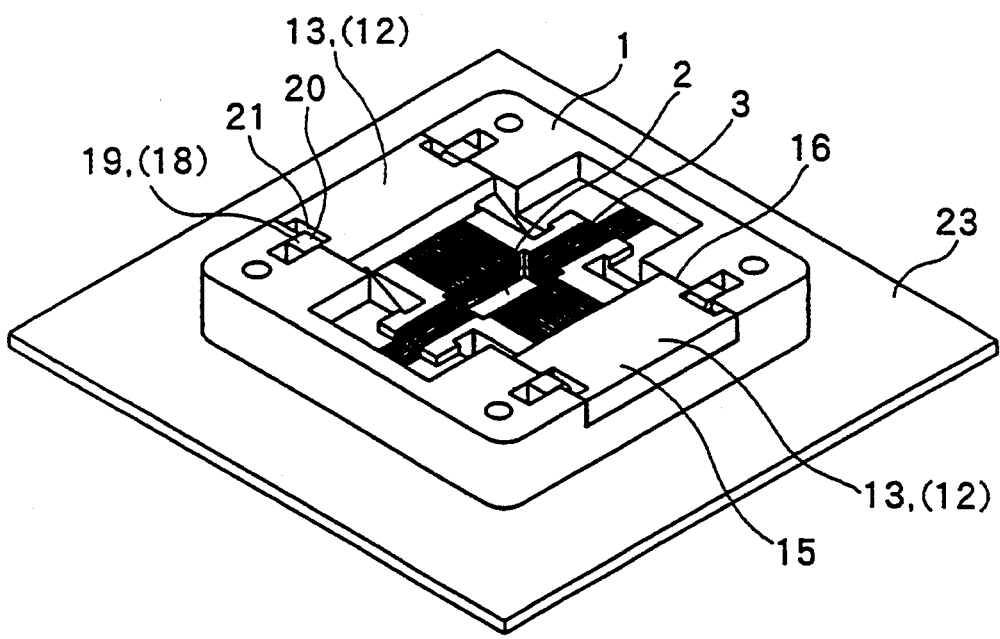
FIG. 1 is a perspective view of an outer appearance of an IC socket according to one embodiment of the present invention, in which an IC is in a raised position.

One embodiment of the present invention will be described in detail with reference to FIGS. 1 through 7 of the accompanying drawing.

As stated previously, this invention relates to an undercharge type socket in which an IC is loaded for an electrical connection from a lower surface side of a socket body.

A socket body 1 includes a generally square IC receiving portion 2 formed in a central portion of the socket body 1. This IC receiving portion 2 has an open top and an open bottom at upper and lower surfaces of the socket body 1. The open bottom of the IC receiving portion 2 is served as an IC loading port, and the open top thereof is served as a window for checking whether an IC is in a good contacting condition.

A number of contacts 3 are implanted in an outer peripheral area of the IC receiving portion 2 along two or four sides of the IC receiving portion 2, such that contacting ends 4 of the contacts 3 are arranged at an area in the vicinity of the open top within the IC receiving portion 2.

Specifically, each of the contacts 3 includes an elongated seat element 5 extending laterally, a contacting arm 6 extending sidewardly from one end of the seat element 5, and a downwardly facing curved spring portion 7 formed at a connecting area between the contacting arm 6 and the seat element 5.

More specifically, the downwardly facing curved spring portion 7 is disposed forwardly of one end portion of the seat element 5. One end of the curved spring portion 7 connectively leads to the seat element 5 and the other end thereof connectively leads to the contacting arm 6.

The contacting arm 6 is provided at a foremost end thereof with the contacting end 4 projecting downwardly and arranged at an area in the vicinity of the open top of the IC receiving portion 2 within the inner peripheral area of the IC receiving portion 2 as previously mentioned.

The IC receiving portion 2 is formed at an outer peripheral area thereof with a plurality of contact receiving grooves 9 extending at right angles from each side of the IC receiving portion 2 and respectively having open tops at the upper surface of the socket body 1. The seat elements 5 are received in the grooves 9, and lower edges of the seat elements 5 are supported on bottom surfaces of the grooves 9 respectively. The contacts 3 are electrically isolated from each other by partition walls provided between adjacent contacts 3.

The contacting arms 6 extend toward the IC receiving portion 2 from front ends of the seat elements 5, with the contacting ends 4 projecting toward the open bottom of the IC receiving portion 2.

Each contacting end 4 is displaced upwardly against the resiliency of the spring portion 7 and displaced downwardly by a restoring force of the spring portion 7. That is, the contacting end 4 is displaced upwardly upon application of the lifting force of the IC 10 and brought into pressure contact with the contacting element of the IC 10 by the restoring force.

Figure 7:
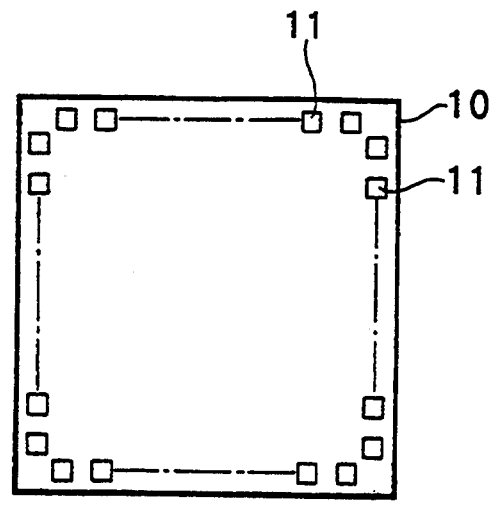
FIG. 7 is a plan view of an IC.

As shown in FIG. 7, the IC 10 is provided with a plurality of contacting elements 11 on its upper surface, i.e., that side of the IC 10 which is served as an upper surface when the IC 10 is loaded in the IC receiving portion 2. The contacting elements 11 are arranged along the edge portion of the upper surface of the IC 10 so that the contacting elements 11 are pressed against the contacting ends 4 to achieve an electrical connection when the IC 10 is lifted within the IC receiving portion 2.

A lifter 12 is provided as the means for lifting the IC 10. This lifter 12 is operated to support a lower surface of a body of the IC 10 inserted into the open bottom of the IC receiving portion 2 and lift the IC 10 toward the open top of the IC receiving portion 2. The contacting elements 11 of the IC 10 are pressed against the contacting ends 4 of the contacts 3 by a lifting force of the lifter 12.

Specifically, the lifter 12 is operated to lift up the IC 10 which in turn causes the contacting ends 4 of the contacts 3 to be lifted upwardly. The contacting ends 4 are brought into pressure contact with the IC contacting elements 11 by a restoring force of the contacting ends 4.

As one example of the lifter 12, a pair of lift levers 13 are arranged on opposite sides of the IC receiving portion 2 in such a manner as to be in symmetrical relation to each other. The pair of lift levers 13 are turnable relative to each other about shafts 17. Each lever 13 has a lift finger 14 formed on one end thereof and an operating arm 15 formed on the other end thereof.

The lift finger 14 extends from each lever 13 downwardly of the contacting ends 4 of the contacts 3 and is vertically turnable under the contacting ends 4 within the IC receiving portion 2.

Each operating arm 15 extends toward the upper surface of the socket body 1 so that it can be vertically turned on the upper surface side of the socket body 1. The arm 15 is rested in a recess 16 formed in the upper surface of the socket body 1, when the arm 15 is fallen.

When the arms 15 are operated to turn about the shafts 17 in such a manner as to be fallen onto the upper surface of the socket body 1, the lift fingers 14 supporting the IC 10 are turned upwardly within the IC receiving portion 2 in order to lift up the IC 10.

When the operating arms 15 are turned about the shafts 17 so as to be escaped from the recesses 16 and raised upwardly of the socket body 1, the lift fingers 14 supporting the IC 10 are turned downwardly within the IC receiving portion 2 to lower the IC 10 by its dead weight. When the lift fingers 14 are turned to the lowermost position, they stop supporting the IC 10. As a result, the IC 10 is dropped by its dead weight.

The IC 10 is brought to the open bottom of the IC receiving portion 2 by a robot or fingers. Then, the operating arms 15 of the pair of levers 13 are turned downwardly and the lift fingers 14 are turned upwardly so that the IC supported at two places of a lower surface of the body thereof by the pair of lift fingers 14 is lifted upwardly.

The lifting operation of the pair of lift fingers 14 causes the contacting elements 11 of the IC 10 to be pressed against the contacting ends 4 of the contact 4 so that the contacting ends 4 are elastically displaced upwardly against the resiliency of the spring portions 7. By the restoring force of the contacting ends 4, the contacting ends 4 are brought into pressure contact with the IC contacting elements.

As means for achieving this pressure contacting condition, i.e., means for holding the IC 10 in its raised position, an engagement means 18 is provided.

Figure 2:
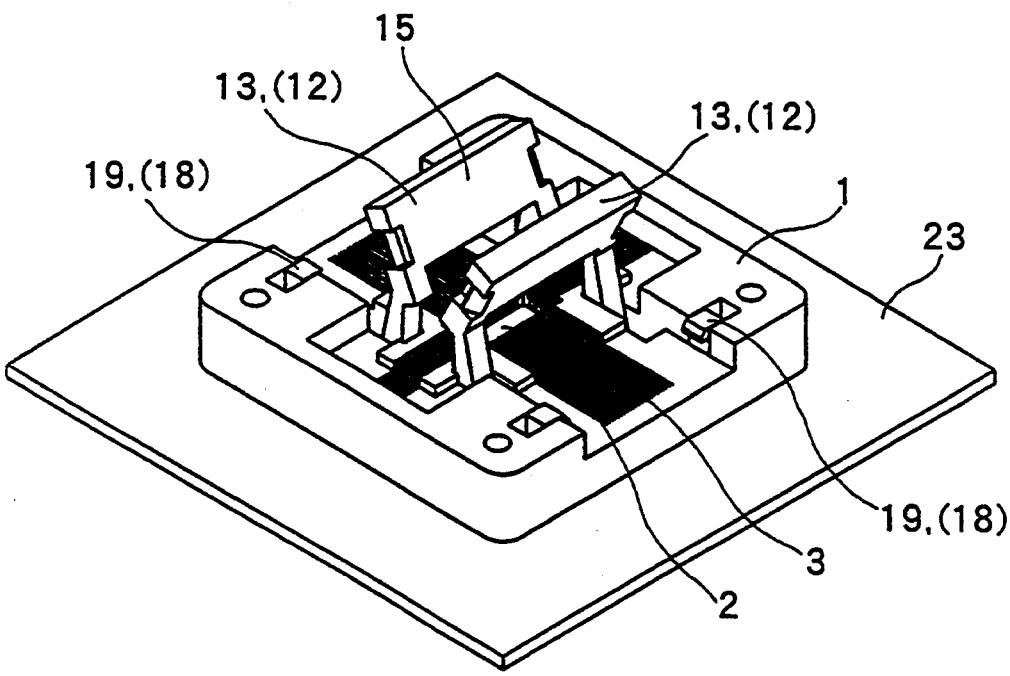
FIG. 2 is likewise a perspective view of the above-mentioned IC socket, but in which the IC is released.

FIG. 1 shows a state in which the engagement means 18 is in engagement with the operating arms 15 of the levers 13 which are fallen onto the upper surface of the socket body 1, and FIG. 2 shows a state in which the engagement means 18 is disengaged from the operating arms 15.

The operating arms 15 of the levers 13 are turned in such a manner as to be fallen onto the upper surface of the socket body 1 and received in the recesses 16 as mentioned. When the operating arms 15 are pressed against the bottom surfaces of the recesses 16, the arms 15 are brought out of engagement with the engagement means 18.

As one example of this engagement means 18, elastically displaceable latches 19 are provided on opposite sides of the recesses 16. The latches 19 extend vertically. A lower end of each latch 19 is integral with the socket body 1 and an upper end thereof is provided with a hook portion 20. This hook portion 20 is operated to be engaged with and disengaged from the edge portion of the corresponding operating arm 15.

The operating arms 15 are provided at opposite sides of their end portions with stepped portions 21 engageable with the hook portions 20. When the operating arms 15 are pushed down, the levers 13 press the latches 19 outwardly so that the latches 19 are displaced against the elasticity. When the hook portions 20 and the stepped portions 21 are placed opposite to each other, the latches 19 are restored inwardly so that the hook portions 20 and the stepped portions 21 are engaged with each other.

When the end portions of the arms 15 are pulled upwardly by force, the latches 19 are brought out of engagement. As a result the operating arms 15 of the lever 13 can be turned upwardly.

The engagement means 18 are brought into engagement with the operating arms 15 of the levers 13 which are in fallen condition, and the IC 10 is held in the uppermost position by the lift fingers 14.

By maintaining the above-mentioned condition, the contacting elements 11 of the IC 10 and the contacting ends 4 of the contacts 3 can be firmly held in pressure contacting condition.

The IC receiving portion 2 has a large space on the side from where the IC 10 is inserted, i.e., open bottom side of the IC receiving portion 2, and a small space on the side where the contacting elements 11 of the IC 10 and the contacting ends 4 of the contacts 3 are contacted with each other, i.e., the open top side of the IC receiving portion 2.

The IC 10 is lifted to the upper small space within the IC receiving portion 2 from the lower large space within the IC receiving portion 2 by the levers 13. The peripheral surface of the IC 10 is restricted by an inner wall surface of that portion of the IC receiving portion 2 having the upper small space and as a result, the contacting elements 11 and the contacting ends 4 are placed in correct corresponding relation.

Figure 3:
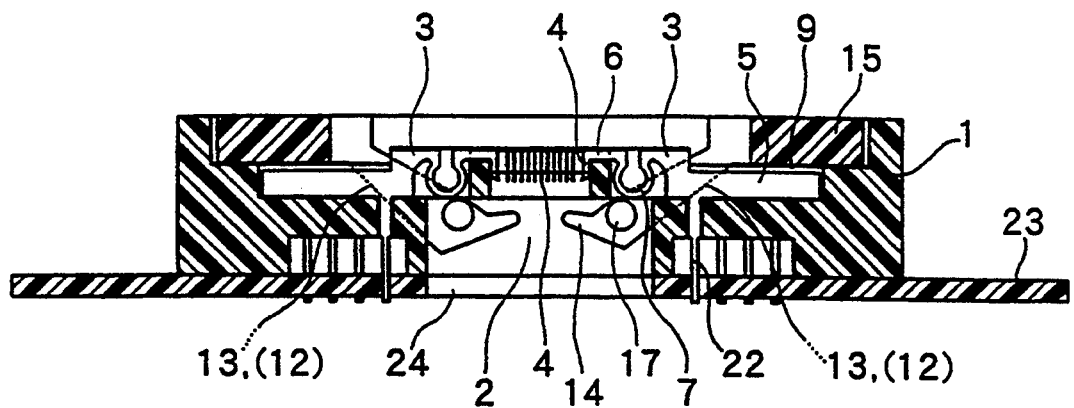
FIG. 3 is a cross-sectional view of the IC socket of FIG. 1, but in which the IC is unloaded yet.
Figure 4:
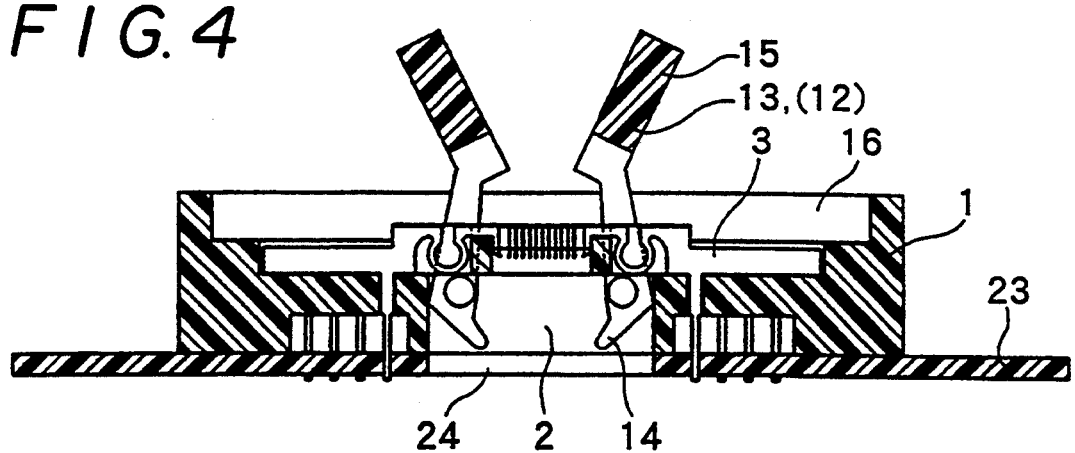
FIG. 4 is a cross-sectional view of the IC socket of FIG. 2, but in which the IC is likewise unloaded yet.
Figure 5:
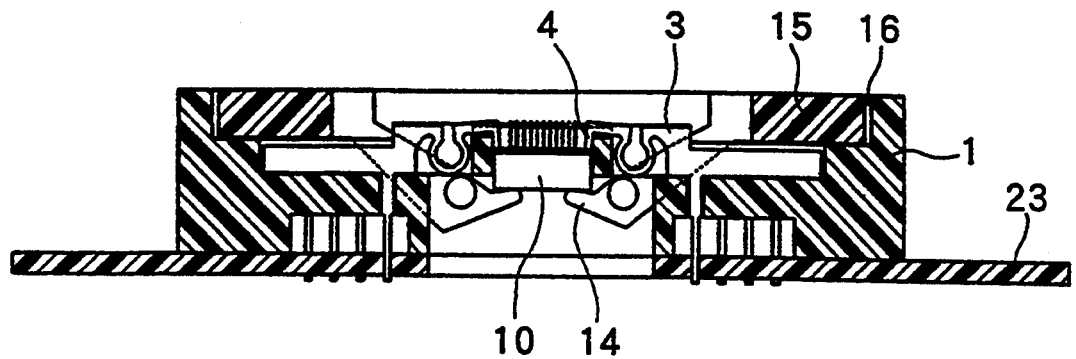
FIG. 5 is a cross-sectional view of the IC socket of FIG. 1, but in which the IC is already loaded.
Figure 6:
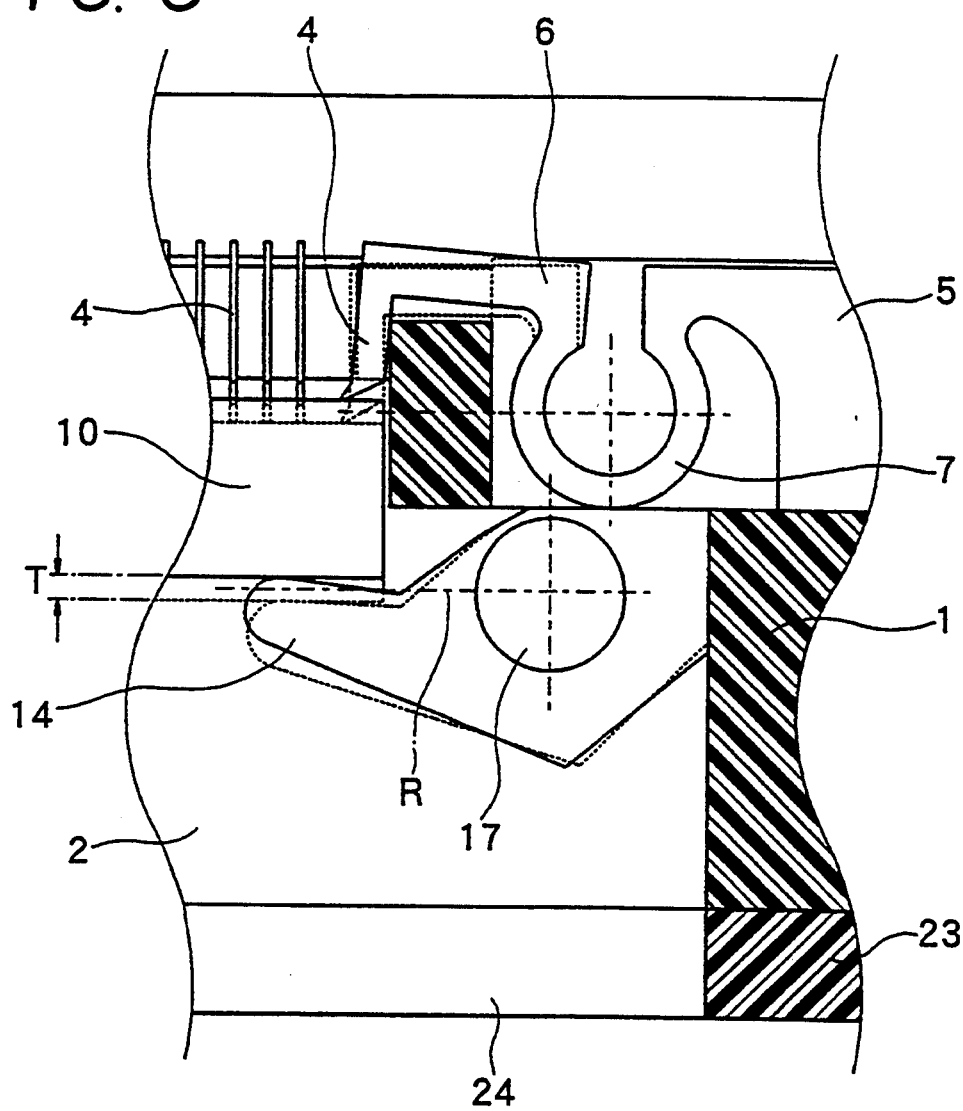
FIG. 6 is an enlarged cross-sectional view showing a lift lever now in pressure contact with contacts.

As shown in FIGS. 3 to 5 and particularly in FIG. 6, the pair of levers 13 are axially supported on opposite end portions of the inner wall of the IC receiving portion 2, preferably that portion of the IC receiving portion 2 having the large space. An upper surface of each lift finger 14 is arranged generally on the diameter R of the shaft 17. The IC 10 is lifted on the diameter R. When the upper surface of the lift finger 14 is brought to be generally horizontal on the diameter R, the IC contacting element 11 starts contacting the contacting end 4 of the contact 3. By turning the levers 13 a limited distance T upwardly from this horizontal line, the IC contacting element 11 pushes up the contacting end 4. As a result, the contacting end 4 is displaced upwardly a distance equal to the distance T so as to be pressure contacted with the IC contacting element 11. As shown in FIG. 6, the shaft 17 of the lever 13 is disposed under the curved spring portion 7 of the contact 3.

Each contact 3 includes a male terminal 22 extending downwardly therefrom. This male terminal 22 extends through the socket body 1 from the inner bottom surface of the contact receiving groove 9 and projects downwardly of the socket body 1 so as to be connected to a wiring board 23 disposed along the lower surface of the socket body 1.

More specifically, the male terminal 22 is inserted into a through-hole formed in the wiring board 23 and soldered, so that the socket body 1 and the wiring board 23 are integrally formed.

The wiring board 23 is provided with an IN inlet port 24 corresponding to the open bottom of the IC receiving portion 2.

The IC 10 is inserted inwardly of the lift fingers 14 of the levers 13 which are in open position, through the IC inlet port 24. Then, by turning the levers 13 in the closing direction, the lift fingers 14 lift up the IC 10 to press the IC contacting elements 11 against the contacts 3 in the same manner as mentioned.

FIG. 4 shows a state in which the levers 13 are turned in the opening direction to stop supporting the IC 10 so as to be ready for receiving the IC again, and FIG. 5 shows a state in which the levers 13 are turned in the closing direction to support and lift up the lower surface of the IC within the IC receiving portion 2 so that the IC is brought into pressure contact with the contact 3.

When the levers 13 are turned in the opening direction in the above-mentioned condition where the IC 10 is in the raised position, the IC 10 is lowered while being supported by the lift fingers 14 of the levers 13. When the lift fingers 14 are fully opened, the IC 10 is dropped out of the IC inlet port 24 for removal.

As a method for contacting the IC 10 with the IC socket, an IC package may of course be contacted directly with the IC socket. As another method, an IC package may first be placed on a carrier and then contacted with the IC socket. However, the IC carrier carrying the IC package is not illustrated.

As described in the foregoing, the IC, which has been brought to the open bottom of the IC receiving portion, is supported and lifted up by the lifter within the IC receiving portion. By this lifting force of the levers, the IC contacting elements are pressed against the contacts to achieve a desirable electrical connection therebetween.

This pressure contacting condition is assuredly maintained by the engagement means engaging the lifter.

On the contrary, by lowering the lifter, the IC is allowed to be lowered by its dead weight so as to facilitate an easy removal of the IC.

According to the present invention, the contacting condition between each IC contacting element and each contact can easily be recognized by eyes through the open top of the IC receiving portion. As a result, it can easily be checked whether the contacting condition is good.

Metal powders produced by friction between the IC contacting elements and the contacts can be naturally dropped through the open bottom of the IC receiving portion or the IC inlet port formed in the wiring board. With this feature, a possible short circuit between the contacts and between the IC contacting elements can effectively be prevented.

Furthermore, according to the present invention, there can be provided an undercharge type IC socket in which the IC is lifted upwardly from under the socket body to achieve a reliable electrical connection. With this feature, the IC socket can be simplified in structure.

The present invention is not limited to the above embodiments, but many modifications can be made without departing from the scope of the appended claims.

What is claimed is:

1. An IC socket including a socket body and an IC receiving portion formed in said socket body and having an open top at an upper surface of said socket body and an open bottom at a lower surface thereof, the IC being loaded into said IC receiving portion through said open bottom, the improvement comprising a lifter for lifting the IC into a raised-position within said IC receiving portion, contacts arranged on said socket body so as to be pressure contacted with contacting elements of the IC by a lifting force of said lifter applied to the IC, and engagement means for engaging said lifter so that the IC is held in the raised-position.

2. An IC socket including a socket body and an IC receiving portion formed in said socket body and having an open top at an upper surface of said socket body and an open bottom at a lower surface thereof, the IC being loaded into said IC receiving portion through said open bottom, the improvement comprising a wiring board integral with said socket body and connected to contacts of said socket body on a lower surface side of said socket body, said wiring board being provided with an IC inlet port corresponding to said open bottom of said IC receiving portion, a lifter for lifting the IC into a raised-position within said IC receiving portion through said IC inlet port, and engagement means for engaging said lifter so that the IC is held in the raised-position.

3. An IC socket as claimed in claim 1, wherein said lifter comprises a pair of levers turnably supported on opposite sides of said IC receiving portion, said pair of levers each having a lift finger so that the IC is lifted into the raised position within said IC receiving portion by said lift fingers holding a lower surface of the IC at two places of the IC.

4. An IC socket as claimed in claim 3, wherein said pair of levers each having an operating arm for turning said lever on an upper surface side of said socket body.

5. An IC socket as claimed in claim 4, wherein said operating arms are rested in recesses formed in the upper surface of said socket body when said pair of levers lift the IC into the raised position.

6. An IC socket as claimed in claim 2, wherein said lifter comprises a pair of levers turnably supported on opposite sides of said IC receiving portion, said pair of levers each having a lift finger so that the IC is lifted into the raised position within said IC receiving portion by said lift fingers holding a lower surface of the IC at two places of the IC.

* * * * *